United States Patent
Seefeldt et al.

(10) Patent No.: US 8,849,433 B2
(45) Date of Patent: Sep. 30, 2014

(54) AUDIO DYNAMICS PROCESSING USING A RESET

(75) Inventors: Alan Jeffrey Seefeldt, San Francisco, CA (US); Kenneth James Gundry, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 251 days.

(21) Appl. No.: 12/442,359

(22) PCT Filed: Sep. 25, 2007

(86) PCT No.: PCT/US2007/020747
§ 371 (c)(1),
(2), (4) Date: Mar. 20, 2009

(87) PCT Pub. No.: WO2008/051347
PCT Pub. Date: May 2, 2008

(65) Prior Publication Data
US 2010/0198377 A1    Aug. 5, 2010

Related U.S. Application Data

(60) Provisional application No. 60/853,127, filed on Oct. 20, 2006.

(51) Int. Cl.
G06F 17/00      (2006.01)
H04H 40/18      (2008.01)
H03G 3/30       (2006.01)
H03G 7/00       (2006.01)

(52) U.S. Cl.
CPC ............ *H03G 3/3005* (2013.01); *H04H 40/18* (2013.01); *H03G 7/002* (2013.01)

USPC .......................................................... 700/94

(58) Field of Classification Search
USPC .......................................................... 700/94
See application file for complete search history.

(56) References Cited

U.S. PATENT DOCUMENTS 2,808,475 A    10/1957   Stryker
4,281,218 A     7/1981   Chuang et al.
(Continued)

FOREIGN PATENT DOCUMENTS

DE    43 35 739      5/1995
DE    198 48 491     4/2000
(Continued)

OTHER PUBLICATIONS

Tube Tech compressor manual (Compressor: available for sale since 2004).*

(Continued)

*Primary Examiner* — Paul McCord (57) ABSTRACT

An audio dynamics processor or processing method that uses a reset mechanism or process in order to adapt quickly to content changes in the audio signal. A reset signal may be generated by analyzing the audio signal itself or the reset may be triggered from an external event such as a channel change on a television set or an input selection change on an audio/visual receiver. In the case of an external trigger, one or more indicators of the state of the dynamics processor for a current audio source may be saved and associated with that audio source before switching to a new audio source. Then, if the system switches back to the first audio source, the dynamics processor may be reset to the state previously stored or an approximation thereof.

12 Claims, 3 Drawing Sheets

(56) References Cited

U.S. PATENT DOCUMENTS

| | | | |
|---|---|---|---|
| 4,543,537 A | 9/1985 | Kuhn et al. | |
| 4,739,514 A | 4/1988 | Short et al. | |
| 4,887,299 A | 12/1989 | Cummins et al. | |
| 5,027,410 A | 6/1991 | Williamson et al. | |
| 5,097,510 A | 3/1992 | Graupe | |
| 5,172,358 A | 12/1992 | Kimura | |
| 5,278,912 A | 1/1994 | Waldhauer | |
| 5,363,147 A | 11/1994 | Joseph et al. | |
| 5,369,711 A | 11/1994 | Williamson, III | |
| 5,377,277 A | 12/1994 | Bisping | |
| RE34,961 E | 6/1995 | Widin et al. | |
| 5,422,602 A | 6/1995 | Werrbach | |
| 5,432,296 A * | 7/1995 | Takeuchi et al. | 84/661 |
| 5,457,769 A | 10/1995 | Valley | |
| 5,500,902 A | 3/1996 | Stockham, Jr. et al. | |
| 5,530,760 A | 6/1996 | Paisley | |
| 5,548,638 A | 8/1996 | Yamaguchi et al. | |
| 5,583,962 A | 12/1996 | Davis et al. | |
| 5,615,270 A | 3/1997 | Miller et al. | |
| 5,617,060 A | 4/1997 | Wilson | |
| 5,632,005 A | 5/1997 | Davis et al. | |
| 5,633,981 A | 5/1997 | Davis | |
| 5,642,075 A * | 6/1997 | Bell | 330/129 |
| 5,649,060 A | 7/1997 | Ellozy et al. | |
| 5,663,727 A | 9/1997 | Vokac | |
| 5,682,463 A | 10/1997 | Allen | |
| 5,712,954 A | 1/1998 | Dezonno | |
| 5,724,433 A | 3/1998 | Engebretson et al. | |
| 5,727,119 A | 3/1998 | Davidson et al. | |
| 5,819,247 A | 10/1998 | Freund et al. | |
| 5,848,171 A | 12/1998 | Stockham, Jr. et al. | |
| 5,862,228 A | 1/1999 | Davis | |
| 5,878,391 A | 3/1999 | Aarts | |
| 5,903,655 A | 5/1999 | Salmi | |
| 5,907,622 A | 5/1999 | Dougherty | |
| 5,909,664 A | 6/1999 | Davis et al. | |
| 5,923,710 A | 7/1999 | Shuholm | |
| 6,002,776 A | 12/1999 | Bhadkamkar et al. | |
| 6,002,966 A | 12/1999 | Loeb et al. | |
| 6,021,386 A | 2/2000 | Davis et al. | |
| 6,041,295 A | 3/2000 | Hinderks | |
| 6,061,647 A | 5/2000 | Barrett | |
| 6,088,461 A | 7/2000 | Lin et al. | |
| 6,094,489 A | 7/2000 | Ishige et al. | |
| 6,108,431 A | 8/2000 | Bachler | |
| 6,125,343 A | 9/2000 | Schuster | |
| 6,148,085 A | 11/2000 | Jung | |
| 6,182,033 B1 | 1/2001 | Accardi et al. | |
| 6,185,309 B1 | 2/2001 | Attias | |
| 6,233,554 B1 | 5/2001 | Heimbigner et al. | |
| 6,240,388 B1 | 5/2001 | Fukuchi | |
| 6,263,371 B1 | 7/2001 | Geagan, III et al. | |
| 6,272,360 B1 | 8/2001 | Yamaguchi et al. | |
| 6,275,795 B1 | 8/2001 | Tzirkel-Hancock et al. | |
| 6,298,139 B1 | 10/2001 | Poulsen et al. | |
| 6,301,555 B2 | 10/2001 | Hinderks | |
| 6,311,155 B1 | 10/2001 | Vaudrey et al. | |
| 6,314,396 B1 | 11/2001 | Monkowski | |
| 6,327,366 B1 | 12/2001 | Uvacek et al. | |
| 6,332,119 B1 | 12/2001 | Hinderks | |
| 6,351,731 B1 * | 2/2002 | Anderson et al. | 704/233 |
| 6,351,733 B1 | 2/2002 | Saunders et al. | |
| 6,353,671 B1 | 3/2002 | Kandel et al. | |
| 6,370,255 B1 | 4/2002 | Schaub et al. | |
| 6,411,927 B1 | 6/2002 | Morin et al. | |
| 6,430,533 B1 | 8/2002 | Kolluru et al. | |
| 6,442,278 B1 | 8/2002 | Vaudrey et al. | |
| 6,442,281 B2 | 8/2002 | Sato et al. | |
| 6,473,731 B2 | 10/2002 | Hinderks | |
| 6,498,855 B1 | 12/2002 | Kokkosoulis et al. | |
| 6,529,605 B1 | 3/2003 | Christoph | |
| 6,535,846 B1 * | 3/2003 | Shashoua | 704/225 |
| 6,570,991 B1 | 5/2003 | Scheirer | |
| 6,625,433 B1 | 9/2003 | Poirier et al. | |
| 6,639,989 B1 | 10/2003 | Zacharov et al. | |
| 6,650,755 B2 | 11/2003 | Vaudrey et al. | |
| 6,651,041 B1 | 11/2003 | Juric | |
| 6,700,982 B1 | 3/2004 | Geurts et al. | |
| 6,782,107 B1 | 8/2004 | Gleim | |
| 6,792,119 B1 * | 9/2004 | Aarts | 381/98 |
| 6,807,525 B1 | 10/2004 | Li et al. | |
| 6,823,303 B1 | 11/2004 | Su et al. | |
| 6,889,186 B1 | 5/2005 | Michaelis | |
| 6,985,594 B1 | 1/2006 | Vaudrey et al. | |
| 7,065,498 B1 | 6/2006 | Thomas et al. | |
| 7,068,723 B2 | 6/2006 | Foote et al. | |
| 7,155,385 B2 | 12/2006 | Berestesky et al. | |
| 7,171,272 B2 | 1/2007 | Blamey et al. | |
| 7,212,640 B2 | 5/2007 | Bizjak | |
| 7,454,331 B2 | 11/2008 | Vinton | |
| 7,590,251 B2 * | 9/2009 | Andersen et al. | 381/106 |
| 7,813,825 B2 * | 10/2010 | Dubowsky | 700/94 |
| 2001/0027393 A1 | 10/2001 | Touimi et al. | |
| 2001/0038643 A1 | 11/2001 | McParland | |
| 2002/0013698 A1 | 1/2002 | Vaudrey et al. | |
| 2002/0040295 A1 | 4/2002 | Saunders et al. | |
| 2002/0076072 A1 | 6/2002 | Cornelisse | |
| 2002/0097882 A1 | 7/2002 | Greenberg et al. | |
| 2002/0146137 A1 | 10/2002 | Kuhnel et al. | |
| 2002/0147595 A1 | 10/2002 | Baumgarte | |
| 2003/0002683 A1 | 1/2003 | Vaudrey et al. | |
| 2003/0035549 A1 | 2/2003 | Bizjak et al. | |
| 2003/0044028 A1 * | 3/2003 | Cranfill et al. | 381/107 |
| 2004/0024591 A1 | 2/2004 | Boillot et al. | |
| 2004/0037421 A1 | 2/2004 | Truman | |
| 2004/0042617 A1 | 3/2004 | Beerends et al. | |
| 2004/0044525 A1 | 3/2004 | Vinton et al. | |
| 2004/0076302 A1 | 4/2004 | Christoph | |
| 2004/0122662 A1 | 6/2004 | Crockett | |
| 2004/0148159 A1 | 7/2004 | Crockett | |
| 2004/0165730 A1 | 8/2004 | Crockett | |
| 2004/0172240 A1 | 9/2004 | Crockett et al. | |
| 2004/0184537 A1 | 9/2004 | Geiger et al. | |
| 2004/0190740 A1 | 9/2004 | Chalupper et al. | |
| 2004/0213420 A1 | 10/2004 | Gundry | |
| 2006/0002572 A1 | 1/2006 | Smithers et al. | |
| 2006/0029231 A1 * | 2/2006 | Henn et al. | 381/1 |
| 2006/0210089 A1 * | 9/2006 | Tashev et al. | 381/66 |
| 2006/0215852 A1 | 9/2006 | Troxel | |
| 2007/0291959 A1 | 12/2007 | Seefeldt | |
| 2009/0009251 A1 * | 1/2009 | Spielbauer | 330/278 |

FOREIGN PATENT DOCUMENTS

| | | |
|---|---|---|
| EP | 0 517 233 | 12/1992 |
| EP | 0 637 011 | 2/1995 |
| EP | 0 661 905 | 5/1995 |
| EP | 0 746 116 | 12/1996 |
| EP | 0972340 | 10/2001 |
| EP | 1 239 269 | 9/2002 |
| EP | 1 251 715 | 10/2002 |
| EP | 1 387 487 | 4/2004 |
| EP | 1 736 966 | 7/2007 |
| FR | 2 820 573 | 8/2002 |
| GB | 2215927 | 9/1989 |
| JP | H05-090857 | 4/1993 |
| JP | H07-307058 | 11/1995 |
| JP | 2003-152483 | 5/2003 |
| WO | WO/98/27543 | 6/1998 |
| WO | WO/00/78093 | 12/2000 |
| WO | WO/02/17678 | 2/2002 |
| WO | WO 03/090208 | 10/2003 |
| WO | WO 2004/019656 | 3/2004 |
| WO | WO 2004/073178 | 8/2004 |
| WO | WO 2004/111994 | 12/2004 |
| WO | WO 2005/086139 | 9/2005 |
| WO | 2005/104360 | 11/2005 |
| WO | WO 2005/104360 | 11/2005 |
| WO | WO 2006/006977 | 1/2006 |
| WO | WO 2006/019719 | 2/2006 |
| WO | WO 2006/047600 | 5/2006 |
| WO | WO 2006/113047 | 10/2006 |
| WO | WO/2007/120452 | 10/2007 |
| WO | WO/2007/120453 | 10/2007 |

(56) References Cited

FOREIGN PATENT DOCUMENTS

| WO | WO 2007/123608 | 11/2007 |
|---|---|---|
| WO | WO/2007/127023 | 11/2007 |
| WO | WO 2008/051347 | 5/2008 |
| WO | WO 2008/057173 | 5/2008 |
| WO | WO/2008/085330 | 7/2008 |
| WO | WO 2008/115445 | 9/2008 |
| WO | WO 2008/156774 | 12/2008 |

OTHER PUBLICATIONS

Australian Government IP Australia, Examiner's first report on patent application No. 2005299410, mailed Jun. 25, 2009, Australian Patent Appln. No. 2005299410.

Israel Patent Office, Examiner's Report on Israel Application No. 182097 mailed Apr. 11, 2010, Israel Patent Appln. No. 182097.

Intellectual Property Corporation of Malaysia, Substantive/Modified Substantive Examination Adverse Report (Section 30(1)/30(2)) and Search Report, dated Dec. 5, 2008, Malaysian Patent Appln. No. PI 20055232.

Dept of Justice & Human Rights of Republic of Indonesia, Directorate General Intellectual Property Rights, First Office Action received Apr. 22, 2010, Indonesian Patent Appln. No. WO0200701285.

State Intellectual Property Office of the People'S Republic of China, Notification of the Third Office Action, mailed Apr. 21, 2010, China Patent Appln. No. 200580036760.7.

European Patent Office Searching Authority, Int'l Search Report and Written Opinion, Int'l Appln. No. PCT/US2004/016964, mailed Jun. 20, 2005.

Seefeldt, et al.; "A New Objective Measure of Perceived Loudness," Audio Engineering Society (AES) $117^{th}$ Convention, Paper 6236, Oct. 28-31, 2004, San Francisco, CA, pp. 1-8.

Chalupper, Josef; "Aural Exciter and Loudness Maximizer: What's Psychoacoustic about Psychoacoustic Processors?," Audio Engineering Society (AES) $108^{th}$ Convention, Sep. 22-25, 2000, Los Angeles, CA, pp. 1-20.

Claro Digital Perception Processing; "Sound Processing with a Human Perspective," pp. 1-8.

Masciale, John M.; "The Difficulties in Evaluating A-Weighted Sound Level Measurements," S&V Observer, pp.-2-3.

Ghent, Jr., et al.; "Expansion as a Sound Processing Tool in Hearing Aids," American Academy of Audiology National Convention, Apr. 29-May 2, 1999, Miami Beach, FL.

Ghent, Jr., et al.; "Uses of Expansion to Promote Listening Comfort with Hearing Aids," American Academy of Audiology $12^{th}$ Annual Convention, Mar. 16-19, 2000, Chicago, IL.

Martinez G., Isaac; "Automatic Gain Control (AGC) Circuits—Theory and Design," University of Toronto ECE1352 Analog Integrated Circuits I, Term Paper, Fall 2001, pp. 1-25.

Park, et al.; "High Performance Digital Hearing Aid Processor with Psychoacoustic Loudness Correction," IEEE FAM P3.1 0-7803-3734-4/97, pp. 312-313.

Bray, et al.; "Optimized Target Matching: Demonstration of an Adaptive Nonlinear DSP System," Sonic Innovations vol. 1 No. 2 1998, pp. 1-4, presented at the American Academy of Audiology, Los Angeles, CA, Apr. 4, 1998.

Bray, et al.; "An "Optimized" Platform for DSP Hearing Aids," Sonic Innovations, vol. 1 No. 3 1998, pp. 1-4, presented at the Conference on Advanced Signal Processing Hearing Aids, Cleveland, OH, Aug. 1, 1998.

Bray, et al., "Digital Signal Processing (DSP) Derived from a Nonlinear Auditory Model," Sonic Innovations, vol. 1 No. 1 1998, pp. 1-3, presented at American Academy of Audiology, Los Angeles, CA, Apr. 4, 1998.

Ghent, Jr., et al.; "Uses of Expansion to Promote Listening Comfort with Hearing Aids," Sonic Innovations, vol. 3 No. 2, 2000, pp. 1-4, presented at American Academy of Audiology $12^{th}$ Annual Convention, Chicago, IL, Mar. 16-19, 2000.

Nilsson, et al.; "The Evolution of Multi-channel Compression Hearing Aids," Sonic Innovations, Presented at American Academy of Audiology $13^{th}$ Convention, San Diego, CA, Apr. 19-22, 2001.

Johns, et al.; "An Advanced Graphic Equalizer Hearing Aid: Going Beyond Your Home Audio System," Sonic Innovations Corporation, Mar. 5, 2001, http://www.audiologyonline.com/articles/pf_arc_disp.asp?id=279.

Smith, et al., "Tandem-Free VoIP Conferencing: A Bridge to Next-Generation Networks," IEEE Communications Magazine, IEEE Service Center, New York, NY, vol. 41, No. 5, May 2003, pp. 136-145.

H. H. Scott, "The Amplifier and Its Place in the High Fidelity System," J. Audio Eng. Soc., vol. 1, No. 3, Jul. 1953.

Nigro, et al., "Concert-Hall Realism through the Use of Dynamic Level Control," J. Audio Eng. Soc., vol. 1, No. 1, Jan. 1953.

Newcomb, et al., "Practical Loudness: an Active Circuit Design Approach," J. Audio eng. Soc., vol. 24, No. 1, Jan./Feb. 1976.

Robinson, et a., Dynamic Range Control via Metadata, $107^{th}$ Convention of the AES, Sep. 14-27, 1999, New York.

Watson, et al., "Signal Duration and Signal Frequency in Relation to Auditory Sensitivity," Journal of the Acoustical Society of America, vol. 46, No. 4 (Part 2) 1969, pp. 989-997.

ATSC Standard A52/A: Digital Audio Compression Standard (AC-3), Revision A, Advanced Television Systems Committee, Aug. 20, 2001. The A/52A document is available on the World Wide Web at http://www./atsc.org.standards.html.

Todd, et al., "Flexible Perceptual Coding for Audio Transmission and Storage," $96^{th}$ Convention of the Audio Engineering Society, Feb. 26, 1994, Preprint, 3796.

Davis, Mark, "The AC-3 Multichannel Coder," Audio engineering Society, Preprint 3774, $95^{th}$ AES Convention, Oct. 1993.

Bosi, et al., "High Quality, Low-Rate Audio Transform Coding for Transmission and Multimedia Applications," Audio Engineering Society Preprint 3365, $93^{rd}$ AES Convention, Oct. 1992.

Fielder, et al., "Introduction to Dolby Digital Plus, an Enhancement to the Dolby Digital Coding System," AES Convention Paper 6196, $117^{th}$ AES Convention, Oct. 28, 2004.

Truman, et al., "Efficient Bit Allocation, Quantization, and Coding in an Audio Distribution System," AES Preprint 5068, $107^{th}$ AES Conference, Aug. 1999.

Fielder, et al., "Professional Audio Coder Optimized fro Use with Video," AES Preprint 5033, $107^{th}$ AES Conference, Aug. 1999.

Brandenburg, et al., "Overview of MPEG Audio: Current and Future Standards for Low-Bit-Rate Audio Coding," J. Audio eng. Soc., vol. 45, No. 1/2, Jan./Feb. 1997.

Vernon, Steve, "Design and Implementation of AC-3 Coders," IEEE Trans. Consumer Electronics, vol. 41, No. 3, Aug. 1995.

Crockett, et al., "A Method for Characterizing and Identifying Audio Based on Auditory Scene Analysis," Audio Engineering Society Convention Paper 6416, $118^{th}$ Convention, Barcelona, May 28-31, 2005.

Crockett, Brett, "High Quality Multichannel Time Scaling and Pitch-Shifting using Auditory Scene Analysis," Audio Engineering Society Convention Paper 5948, New York, Oct. 2003.

Hauenstein M., "A Computationally Efficient Algorithm for Calculating Loudness Patterns of Narrowband Speech," Acoustics, Speech and Signal Processing 1997. 1997 IEEE International Conference, Munich Germany, Apr. 21-24, 1997, Los Alamitos, Ca, USA, IEEE Comput. Soc., US, Apr. 21, 1997, pp. 1311-1314.

Cheng-Chieh Lee, "Diversity Control Among Multiple Coders: A Simple Approach to Multiple Descriptions," IEE, September.

Moore, et al., "A Model for the Prediction of Thresholds, Loudness and Partial Loudness," Journal of the Audio Engineering Society, Audio Engineering Society, New York, vol. 45, No. 4, Apr. 1997, pp. 224-240.

Glasberg, et al., "A Model of Loudness Applicable to Time-Varying Sounds," Journal of the Audio Engineering Society, Audio Engineering Society, New York, vol. 50, No. 5, May 2002, pp. 331-342.

Stevens, "Calculations of the Loudness of Complex Noise," Journal of the Acoustical Society of America, 1956.

Zwicker, "Psychological and Methodical Basis of Loudness," Acoustica, 1958.

Australian Broadcasting Authority (ABA), "Investigation into Loudness of Advertisements," Jul. 2002.

(56) References Cited

OTHER PUBLICATIONS

Zwicker, et al., "Psychoacoustics—Facts and Models," Springer-Verlag, Chapter 8, "Loudness," pp. 203-238, Berlin Heidelberg, 1990, 1999.
Lin, L., et al., "Auditory Filter Bank Design Using Masking Curves," 7th European Conference on Speech Communications and Technology, Sep. 2001.
IS0226: 1987 (E), "Acoustics—Normal Equal Loudness Level Contours."
Seo, et al., "Auditory Model Design for Objective Audio Quality Measurement," Department of Electronic Engineering, Dongguk University, Seoul Korea.
Moulton, Dave, "Loud, Louder, Loudest!," Electronic Musician, Aug. 1, 2003.
Riedmiller, Jeff, "Working Toward Consistency in Program Loudness," Broadcast Engineering, Jan. 1, 2004.
Robinson, et al., "Time-Domain Auditory Model for the Assessment of High-Quality Coded Audio," 107th AES Convention, Sep. 1999.
Hermesand, et al., "Sound Design—Creating the Sound for Complex Systems and Virtual Objects," Chapter II, "Anatomy and Psychoacoustics," 2003-2004.
Notification of Transmittal of the International Search Report, PCT/US2006/011202, dated Aug. 9, 2006.
Written Opinion of the International Search Authority, PCT/US2006/011202, dated Aug. 9, 2006.
Carroll, Tim, "Audio Metadata: You can get there from here", Oct. 11, 2004, pp. 1-4, XP002392570. http://tvtechnology.com/features/audio_notes/f-TC-metadata-08.21.02.shtml.
Trapee, W., et al., "Key distribution for secure multimedia multicasts via data embedding," 2001 IEEE International Conferenced on Acoustics, Speech, and Signal Processing. May 7-11, 2001.
Bertsekas, Dimitri P., "Nonlinear Programming," 1995, Chapter 1.2 "Gradient Methods—Convergence," pp. 18-46.
Bertsekas, Dimitri P., "Nonlinear Programming," 1995, Chapter 1.8 "Nonderivative Methods,", pp. 142-148.
Moore, BCJ, "Use of a loudness model for hearing aid fitting, IV. Fitting hearing aids with multi-channel compression so as to restore "normal" loudness for speech at different levels." British Journal of Audiology, vol. 34, No. 3, pp. 165-177, Jun. 2000, Whurr Publishers, UK.
Saunders, "Real-Time Discrimination of Broadcast Speech/Music," Proc. of Int. Cont'. on Acoust. Speech and Sig. Proce., 1996, pp. 993-996.
Bosi, et al., "ISO/IEC MPEG-2 Advanced Audio coding," J. Audio Eng. Soc., vol. 45, No. 10, Oct. 1997, pp. 789-814.
Scheirer and Slaney, "Construction and Evaluation of a robust Multifeature Speech/Music Discriminator," Proc. of Int. Conf. on Acoust. Speech and Sig. Proc., 1997, pp. 1331-1334.
Schapire, "A Brief Introduction to Boosting," Proc. of the 16th Int. Joint Conference on Artificial Intelligence, 1999.
Guide to the Use of the ATSC Digital Television Standard, Dec. 4, 2003.
ISO Standard 532:1975, published 1975.
Belger, "The Loudness Balance of Audio Broadcast Programs," J. Audio Eng. Soc., vol. 17, No. 3, Jun. 1969, pp. 282-285.
Atkinson, I. A., et al., "Time Envelope LP Vocoder: A New Coding Technology at Very Low Bit Rates," 4th ed., 1995, ISSN 1018-4074, pp. 241-244.
Mapes, Riordan, et al., "Towards a model of Loudness Recalibration," 1997 IEEE ASSP workshop on New Paltz, NY USA, Oct. 19-22, 1997.
CEI/IEC Standard 60804 published Oct. 2000.
Blesser, Barry, "An Ultraminiature console Compression System with Maximum User Flexibility," Journal of Audio Engineering Society, vol. 20, No. 4, May 1972, pp. 297-302.
Hoeg, W., et al., "Dynamic Range Control (DRC) and Music/Speech Control (MSC) Programme-Associated Data Services for DAB", EBU Review-Technical, European Broadcasting Union, Brussels, BE, No. 261, Sep. 21, 1994.
Soulodre, GA, "Evaluation of Objective Loudness Meters" Preprints of Papers Presented at the 116th AES Convention, Berlin, Germany, May 8, 2004.
Notification of Transmittal of the International Search Report, PCT/US2007/08313), dated Sep. 21, 2007.
The Written Opinion of the International Searching Authority, PCT/US2007/08313), dated Sep. 21, 2007.
Notification of Transmittal of the International Search Report, PCT/US2007/007946, dated Aug. 21, 2007.
The Written Opinion of the International Searching Authority, PCT/US2007/007946, dated Aug. 21, 2007.
Notification of Transmittal of the International Search Report, PCT/US2007/007945, dated Aug. 17, 2007.
The Written Opinion of the International Searching Authority, PCT/US2007/007945, dated Aug. 17, 2007.
Notification of Transmittal of the International Search Report, PCT/US2007/0025747, dated Apr. 14, 2008.
The Written Opinion of the International Searching Authority, PCT/US2007/0025747, dated Apr. 14, 2008.
International Search Report, PCT/US2004/016964 dated Dec. 1, 2005.
Written Opinion of the International Searching Authority, PCT/US2004/016964 dated Dec. 1, 2005.
International Search Report, PCT/US2006/010823 dated Jul. 25, 2006.
Written Opinion of the International Searching Authority, PCT/US2006/010823 dated Jul. 25, 2006.
International Search Report, PCT/US2005/038579 dated Feb. 21, 2006.
Written Opinion of the International Searching Authority, PCT/US2005/038579 dated Feb. 21, 2006.
International Search Report, PCT/US2007/022132 dated Apr. 18, 2008.
Written Opinion of the International Searching Authority, PCT/US2007/022132 dated Apr. 18, 2008.
International Search Report, PCT/US2007/006444 dated Aug. 28, 2007.
Written Opinion of the International Searching Authority, PCT/US2007/006444 dated Aug. 28, 2007.
Notification of Transmittal of the International Search Report, PCT/US2008/007570, dated Sep. 10, 2008.
The Written Opinion of the International Searching Authority, PCT/US2008/007570, dated Sep. 10, 2008.
International Search Report, PCT/US2007/020747, dated May 21, 2008.
Written Opinion of the International Searching Authority, PCT/US2007/020747, dated May 21, 2008.
Mexican Patent Application No. Pa/a/2005/002290—Response to Office Action dated Oct. 5, 2007.
Communication Under Rule 51(4) EPC, European Patent Office, EP Application No. 03791682.2-2218, dated Dec. 5, 2005.
Notification of the First Office Action, Chinese Application No. 03819918.1, dated Mar. 30, 2007.
Response to Notification of the First Office Action, Chinese Application No. 03819918.1, dated Aug. 14, 2007.
Response Office Action from the Israel Patent Office, Israel Patent Application No. 165,398, dated Dec. 29, 2008.
Official Letter from the Intellectual Property Bureau, Ministry of Economic Affairs, Taiwan, dated Mar. 21, 2008.
Response to Official Letter from the Intellectual Property Bureau, Ministry of Economic Affairs, Taiwan, dated Jun. 25, 2008.
Written Opinion of the Intellectual Property Office of Singapore, Singapore Application No. 0702926-7, dated May 12, 2008.
European Patent Office, Office Action dated Apr. 2, 2008, EP Application No. 05818505.9.
European Patent Office, Response to Office Action dated Apr. 2, 2008, EP Application No. 05818505.9.

* cited by examiner

AUDIO DYNAMICS PROCESSING USING A RESET

TECHNICAL FIELD

The invention relates to audio signal processing. In particular, the invention relates to an audio dynamics processor or processing method that uses a reset mechanism or process in order to adapt quickly to content changes in the audio signal. A reset signal may be generated by analyzing the audio signal itself or the reset may be triggered from an external event such as a channel change on a television set or an input selection change on an audio/visual receiver. In the case of an external trigger, one or more indicators of the state of the dynamics processor for a current audio source may be saved and associated with that audio source before switching to a new audio source. Then, if the system switches back to the first audio source, the dynamics processor may be reset to the state previously stored or an approximation thereof. The invention also relates to computer programs for practicing such methods or controlling such apparatus.

BACKGROUND ART

An object of audio dynamics processing is to alter the level or dynamics of an audio signal to be within some desired limits. This is generally achieved by creating a time-varying measure of an audio signal's level (rms level or peak level, for example) and then computing and applying a time-varying signal modification (a gain change, for example) that is a function of the level estimate. Dynamics processors employing such a mode of operation include automatic gain controls (AGCs), dynamic range controls (DRCs), expanders, limiters, noise gates, etc. Various types of signal dynamics processing are set forth in International Patent Application PCT/US 2005/038579 of Alan Jeffrey Seefeldt, published as WO 2006/047600 on May 4, 2006. The application designates the United States among other entities. The application is hereby incorporated by reference in its entirety.

Figure 1:
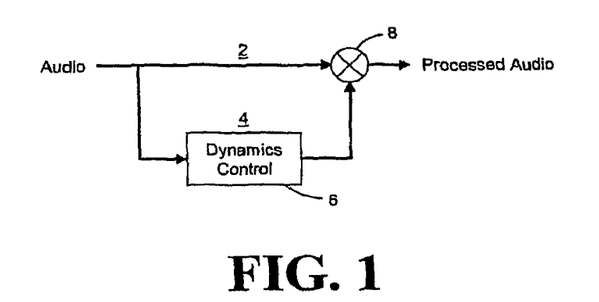
FIG. 1 is a schematic functional block diagram showing, at a high level, a generic audio dynamics processor.

FIG. 1 depicts a high level block diagram of a generic audio dynamics processor. The processor may be considered to have two paths, an upper "signal" path 2 and a lower "control" path 4. On the lower path, a dynamics control process or controller ("Dynamics Control") 6 measures the level of the audio signal and generates one or more time-varying modification parameters as a function of the level measure. As shown, the modification parameters are derived from the input audio signal. Alternatively, the modification parameters may be derived from the processed (output) audio or from a combination of the input and output audio signals. On the upper audio path 2, the modification parameters generated by the Dynamics Control 6 are applied to the audio to generate the processed audio. The application of modification parameters to an audio signal may be accomplished in many known ways and is shown generically by the multiplier symbol 8. For example, in the case of a simple automatic gain control device or process, there may be a single wideband gain modification parameter that controls the gain of a variable gain/loss device or process in the main path. In practice, the audio may also be delayed prior to the application of the modification parameters in order to compensate for any delay associated with the computation of the modification parameters in the dynamics control process. For simplicity in presentation, a delay is not shown in FIG. 1 or other figures herein.

In a dynamics control process, it is typical that both the signal level measure and the resulting modification parameters are computed continuously over time. In addition, either or both the signal level measure and the modification parameters are usually smoothed across time to minimize perceptible artifacts from being introduced into the processed audio. The smoothing is most often performed using a "fast attack" and a "slow release", meaning that the modification parameters change relatively quickly in response to an increase in the signal level and respond more slowly as the signal level decreases. Such smoothing is in accordance with the dynamics of natural sounds and the way in which humans perceive changes in loudness over time. Consequently, such time smoothing is nearly universal in audio dynamics processors.

For some dynamics processing applications, the time constants associated with such smoothing may be quite large; on the order of one or more seconds. An AGC, for instance, may compute an estimate of the long-term average level of a signal using large time constants and then use the resulting estimate to generate slowly varying modification parameters that move the average level of the audio closer to a desired target level. In this case, large time constants may be desirable in order to preserve the short-term dynamics of the audio signal. Suppose that such an AGC is operating on the audio of a television set with the intent of maintaining a consistent average level across programming and across various channels. In such a situation, the content of the audio signal being processed by the AGC may abruptly change or have a discontinuity, when a channel is changed for example, and the associated average level of the audio signal may therefore also abruptly change or have a discontinuity. With its large time constants, however, the AGC takes a considerable amount of time to converge to a new level and bring the modified level of the processed audio in line with the desired target level. During such adaptation time, a viewer of the television may perceive the level of the audio to be too loud or too soft. As a result, the viewer may quickly reach for the remote control to adjust the volume—only to find himself or herself fighting the AGC as it converges.

A typical prior art solution to the problem just described involves using time constants that adapt based on the dynamics of the signal. For example, if the short-term level of the signal is significantly greater or less than the smoothed level as defined by some threshold boundaries around the smoothed level, then the smoothing operation switches to faster attack and/or release time constants, respectively, until the short-term level falls back within the threshold boundaries around the smoothed level. Subsequently, the system switches back to the original slower time constants. Such a system may reduce the adaptation time of the AGC, but the thresholds and shorter time constants must be chosen carefully. In general, for any reasonable thresholds, signals may exist in which the original desired signal dynamics fluctuate outside of the threshold boundaries around the average level, thus causing the smoothing process to falsely switch into the fast attack or release mode. Due to the possibly frequent occurrence of such false switching, the fast attack and release mode time constants must not be chosen to be too short in order to avoid instability of the AGC during normal program material. As a result, the convergence of the AGC during abrupt transitions or discontinuities in the audio content may still not be as fast as desired.

It is therefore the object of the present invention to provide a better solution to the problem of dynamics processing adaptation time during audio content changes.

DISCLOSURE OF THE INVENTION

According to an aspect of the invention, a method for processing an audio signal (or apparatus practicing the method) includes altering the dynamics of the audio signal in accordance with a dynamics control process, detecting a change in the content of the audio signal, and resetting the dynamics control process in response to detecting such a change. Detecting a change in the content of the audio signal may comprise one or both of (1) detecting an occurrence in the temporal evolution of the audio signal in which the level of the audio signal remains below a threshold, $L_{silence}$, throughout a time interval no shorter than a first time threshold, $t_{silence}$, and (2) detecting an occurrence in the temporal evolution of the audio signal in which the level of the audio signal decreases by an amount greater than a difference threshold, $L_{drop}$, within a time interval no greater than a second time threshold, $t_{drop}$.

According to another aspect of the invention, a method for processing an audio signal (or apparatus practicing the method) includes altering the dynamics of the audio signal in accordance with a dynamics control process, receiving an externally-supplied reset trigger signal indicating a change in the audio signal, and resetting the dynamics control process in response to the reset trigger signal. The reset trigger signal may indicate one or more of (1) the act of a user changing a channel, (2) the act of a user changing input sources, (3) the act of a user selecting a play, rewind or forward function, (4) the switching of one file to another, (5) a change in program, (6) the switching of one audio coding format to another, and (7) a change in coding parameters.

According to either of the above aspects, resetting the dynamics control process may speed up the rate at which the dynamics processing adapts to changes in the input signal. Resetting the dynamics control process may set the value of one or more process-controlling parameters or a signal of which such one or more process-controlling parameters are a function to a stored or default value. Resetting the dynamics control process may shorten the value of one or more time constants employed in determining one or more process-controlling parameters or a signal of which such one or more process-controlling parameters are a function.

Figure 2:
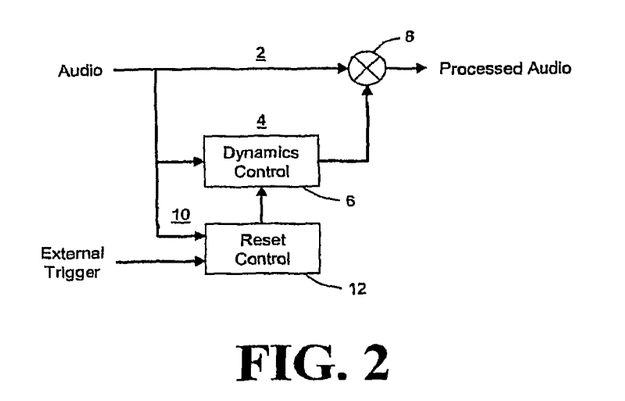
FIG. 2 is a schematic functional block diagram showing, in accordance with aspects of the present invention, an example of an embodiment of the present invention, in which, in a general form, a further control path, a reset control path, is added to the generic dynamics processor of FIG. 1.

Although the adaptive-time-constants approach described above may be somewhat helpful in reducing the adaptation time of an audio dynamics processor or process and may be used along with aspects of the present invention, such a processor or process may be improved significantly by augmenting it with an explicit reset mechanism or process that is activated upon the occurrence of certain abrupt changes or discontinuities in the content of the audio signal being processed. FIG. 2 depicts the present invention in a general form in which a further control path, a reset control path 10, is added to the generic dynamics processor of FIG. 1. A reset control mechanism or process ("Reset Control") 12 may respond to one or both of the audio signal itself (the input audio signal or a combination of the input and output audio signals) and an external trigger signal. Thus, there are three possible configurations: (1) the audio signal itself (which, in turn may comprise the input audio signal or a combination of the input and output audio signals), (2) an external trigger signal, and (3) both the audio signal itself and an external trigger signal. If a decision to reset is made by Reset Control 12, the reset control mechanism or process sends a reset message to the Dynamics Control 6, instructing it to reset certain aspects of its dynamics control state in a way that allows the audio dynamics processing to rapidly adapt to the new level of the incoming audio signal. The resetting of certain aspects of the dynamics control state may, for example, (1) set one or more time constants to a shorter value for a short period of time (thereby speeding up the adaptation rate of the audio processing), and/or (2) set a smoothed measure of the audio signal level or one or more modification parameters to a stored value or to an average or default value.

Analyzing the Audio Signal to Determine the Occurrence of an Abrupt Change or Discontinuity in Signal Content A reset decision may be initiated by Reset Control 12 in a number of ways, for example, by analyzing the incoming audio signal itself or by receiving an external reset trigger signal. In analyzing the audio signal, the Reset Control 12 attempts to detect conditions in the signal indicative of an abrupt change or discontinuity in content. Upon detecting such a condition with a certain degree of confidence, Reset Control 12 makes a reset decision and subsequently instructs Dynamics Control 6 to reset one or more aspects of its dynamics control state. Although other techniques may be utilized to detect abrupt changes or discontinuities in signal content, two practical and effective examples for doing so are described below.

Using an External Trigger to Determine the Occurrence of an Abrupt Change or Discontinuity in Signal Content In many applications, highly reliable external information may be available to trigger a reset. For example, in a television set or cable "set-top box", the act of a user changing a channel may serve as an external trigger of a reset. Also, in a television or audio/video receiver, the act of a user changing input sources, for example from "Video 1" to "Video 2", may serve to trigger a reset. Other examples include a file-based media player, for example, a portable audio device or a digital video recorder. In such cases, a reset may be triggered externally when the system finishes playing one file and switches to another. A reset might also be triggered when a user explicitly changes files himself or herself, presses play, or fast forwards or rewinds to a new location in a piece of content. In the case in which the audio being processed has been decoded from a digital data compressed stream, Dolby Digital audio, for example, other sources of an external reset trigger signal may exist. "Dolby" and "Dolby Digital" are trademarks of Dolby Laboratories Licensing Corporation. For example, the Dolby Digital audio coding system is the mandatory audio format for High Definition Television in the United States. On a given channel of programming, the audio is sent continuously, but the Dolby Digital format may change at program boundaries. For example, the main program may be encoded in 5.1 channel format, but a commercial may be encoded in stereo format. A Dolby Digital decoder necessarily detects such changes and may pass the information to the audio dynamics processor of the present invention as a reset trigger. Other changes in coding parameters may also be employed, for example changes in the Dolby Digital dialog normalization parameter, "DIALNORM", that generally is held constant for a single piece of content. A similar external reset trigger may be generated from other audio coding formats as well, such a MP3 and AAC. In addition to the sources of external reset triggers just listed, others are possible, and the invention is not meant to be limited by those listed.

Figure 3:
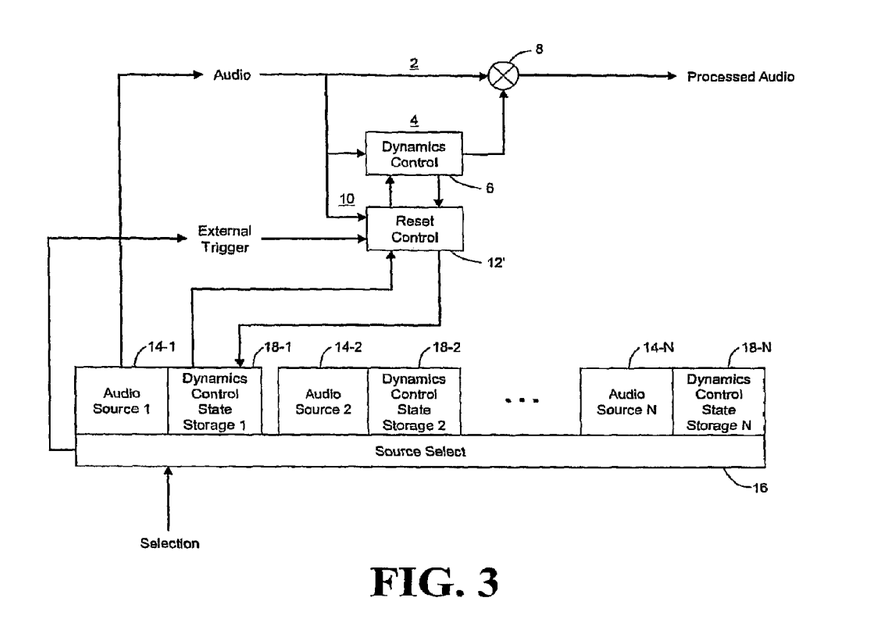
FIG. 3 is a schematic functional block diagram showing, in accordance with aspects of the present invention, an example of an embodiment of the present invention, in which an audio dynamics processor is further enhanced.

In the case where the invention is used in a device in which the audio may originate from a set of known sources, the invention may be further enhanced as shown in FIG. 3. Along the bottom of the figure are depicted N audio sources ("Audio Source 1" through "Audio Source N") 14-1 through 14-N, where it is assumed that one of the N audio sources is selected for playback through the dynamics processing system by way of a source selection device or process ("Source Select") 16. Such audio sources could represent, but are not limited to, various channels on a television or set-top box, the various inputs on an audio/visual receiver, or various files on a portable media player. Stored with each audio source are indicators of the state of one or more aspects of the dynamics control process as it existed the last time that audio particular source was played. Such aspects of the state of the dynamics control may include, for example, one or more of (1) the smoothed measure of the audio signal level, (2) one or more modification parameters resulting from the smoothed measure of the audio signal level, and (3) one or more of the time constants employed in obtaining a smoothed measure of the audio signal level. In an exemplary embodiment described below, the smoothed measure of the audio signal level is employed, which indirectly affects the gain modification parameter (in the example, gain is a function of the smoothed audio signal level). When a different audio source is selected through the source select process, prior to actually switching to the new audio source, the Source Select 16 sends an external reset trigger to the Reset Control 12'. This in turn causes the Reset Control 12' to capture indicators of the current state of the dynamics control process for the currently playing audio source. The Reset Control 12' then saves indicators of the dynamics control state in the N dynamics control state storage locations associated with the current audio selection (Dynamic Control State Storage 1 through N) 18-1 through 18-N. Next, the Source Select 16 switches to the new audio source and sends the associated stored indicators of the dynamics control state to the reset control process that in turn resets the dynamics control process using the stored state indicators.

By using aspects of the last dynamics control state of an audio source to reset the dynamics control process when switching to that source, better performance may be achieved than in the absence of employing such an initial state. Without such information, the dynamics control process relies on the incoming audio signal after the reset as it adapts to the new audio source. On a short-term basis, the level of the audio may fluctuate rapidly, and therefore the modification parameters may also fluctuate rapidly as the dynamics control process attempts to adapt rapidly to the new audio. By using aspects of the last state of the dynamics processor associated with the audio source to reset the dynamics processor, it is likely that the dynamics processor will begin in a state that is closer to the state to which it will eventually converge for that audio source. As a result, the fast adaptation time constants after the reset need not be decreased as much as may otherwise be required, thereby providing improved stability without sacrificing overall adaptation time. As an example, consider switching between two television stations, the first with audio at an average level of −15 dB relative to full-scale digital and the second with audio at an average level of −30 dB, both with a range of plus or minus 5 dB around their respective average. Suppose that just before switching to the second station, the average level of the first station is at −13 dB. Suppose further that the average level of the second station is at −33 dB after the switch. This is a difference of −20 dB. If one desires the dynamics processing system to adapt in half a second, for example, an adaptation rate of −40 dB per second is required in the absence of any other information. Such a rate is quite fast and may introduce instability in the processed audio. On the other hand, suppose that the last dynamics processing state stored with the second station corresponds to a level of −28 dB. Then, after the reset, the dynamics control process may be reset with this state and a difference of only −33 dB−(−28 dB)=−5 dB exists. Thus, an adaptation rate of only −10 dB per second (requiring less of a shortening of the time constant) is required to converge to the desired level within half a second. This example illustrates the advantages in storing the last state of the dynamics control process with the audio source that resulted in such state.

The Effect when a Reset is Triggered

Triggering a reset speeds up the audio dynamics processing adaptation rate (the rate at which the dynamics processing adapts to changes in the input signal). For example, when a reset is triggered, one or more time constants associated with the adaptation rate may quickly switch to significantly smaller values and then smoothly return to their original large values over a specified period of time. Alternatively, the one or more time constants may switch to significantly smaller values and remain at such values for a specified period of time. In an AGC arrangement, a time constant control signal $c[t]$ may momentarily decrease the time constants used in computing the smoothed average level. For example, the smoothing time constants may be decreased over a duration of approximately one second following a reset. In an example embodiment, the time constant control signal $c[t]$ may start at a value of "1" (indicating a maximum change effect on one or more time constants) upon occurrence of a reset trigger; when it is "1" the attack and release coefficients are set to values significantly smaller than their nominal values. As $c[t]$ decays to zero over a short period of time such as one second (the length of the time period is not critical), the coefficients are interpolated back to their nominal normal (non-reset) values. Alternatively or in addition, upon occurrence of a reset trigger, the value of a smoothed average level computed by the dynamics control process may be reset to a state stored with a particular audio source or to a default value.

BEST MODE FOR CARRYING OUT THE INVENTION

The described invention is applicable to a wide variety of dynamics processing applications, such as dynamic range control, compressors, limiters, expanders, etc. It is particularly useful, however, when applied to an AGC in which, typically, large time constants result in slow adaptation in the absence of the present invention. Thus, the preferred embodiment describes, as an example, the invention's application to an AGC.

Basic AGC Implementation

Figure 4:
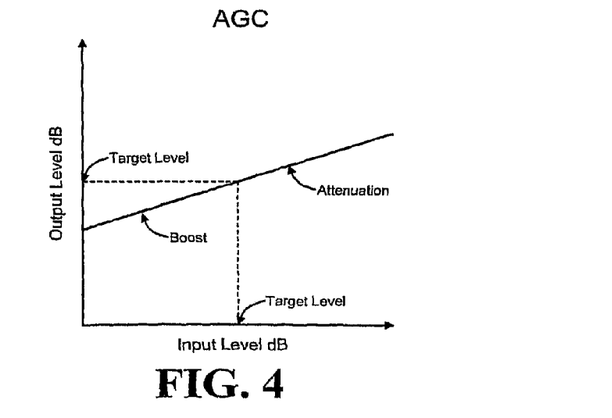
FIG. 4 shows an exemplary input/output function for a typical automatic gain control (AGC).

A basic implementation of an AGC computes a time-varying estimate of a signal's average level and computes a desired modified output level that is a function of the input level and a desired target level. A time varying signal modification may then be computed as a function of the difference between the input level and the desired output level. The function mapping input to output is designed to bring the level of the modified audio closer to the desired target level, and FIG. 4 depicts one such input/output function. For an input above the target level, the AGC calls for signal attenuation, and for an input below the target level, the AGC calls for signal boost. The degree of attenuation or boost may be controlled by varying the slope of the line in FIG. 4.

Ideally, the measure used to compute the average level of the audio should correlate with the human perception of loudness. This may be achieved in many ways; for example, by a weighted mean-square power measure or a psychoacoustic loudness measure. A simple unweighted mean-square power measure is slightly less accurate than the two methods just mentioned, but still demonstrates a high degree of correlation with human loudness perception for most real-world audio signals. Due to its computational simplicity, an unweighted mean-square power measure is used in a preferred embodiment, but should not be seen as limiting the invention.

Although, in principle, aspects of the invention may be implemented in analog and/or digital domains, practical implementations are likely to be implemented in the digital domain in which each of the audio signals are represented by individual samples or samples within blocks of data. The input level estimate and the corresponding desired output level and signal modification parameters may be computed continuously for an analog audio signal or on a sample by sample basis from a digital signal, but for this example embodiment it is instead desirable to compute such quantities for consecutive overlapping blocks of samples of a digital audio signal. This is due mainly to the fact that digital block processing is useful for detecting reset conditions from the signal itself, as is described later. Letting the digital audio signal be represented by x[n], the overlapping blocks of the audio signal may be computed as:

$$x[n,t] = w[n] x[n+tN/2] \quad (1)$$

for $0 \leq n < N-1$
where N is the block length, N/2 is the degree of overlap between consecutive blocks, t is the block index, and w[n] is a window function, such as a sine window. For signals sampled at 44100 Hz, setting N=512 or N=1024 works well. Further details of a digital audio processing arrangement employing overlapping blocks of samples are set forth in U.S. Pat. No. 5,899,969 of Fielder et al ("Frame-based audio with gain-control words"), which patent is hereby incorporated by reference in its entirety. As is described below, the AGC computes a time varying gain G[t] that is then multiplied with each block of the signal. Each of these modified blocks is then overlap-added to produce the final modified audio signal y[n+tN/2]:

$$y[n+tN/2] = G[t] x[n,t] + G[t-1] x[n+N/2, t-1] \quad (2)$$

for $0 \leq n < N/2$

As a first step in computing the gain G[t], the time-varying instantaneous level of the signal L[t] is computed as the mean square power of each block x[n,t]. In decibels, the level is computed as:

$$L[t] = 10 \log_{10}\left( \frac{1}{N} \sum_{n=0}^{N-1} x^2[n,t] \right) \quad (3)$$

where 0 dB corresponds to the level of a full scale digital square wave.

Next, the instantaneous level may be smoothed with a fast attack and a slow release to generate a smoothed average level of the audio signal $\bar{L}[t]$:

$$\bar{L}[t] = \begin{cases} \alpha[t] \cdot \bar{L}[t-1] + (1-\alpha[t]) L[t] & L[t] \geq L_{min} \\ \bar{L}[t-1] & L[t] < L_{min} \end{cases} \quad (4a)$$

where $$\alpha[t] = \begin{cases} \alpha_{attack} & L[t] \geq \bar{L}[t-1] \\ \alpha_{release} & L[t] < \bar{L}[t-1] \end{cases} \quad (4b)$$

and $$\alpha_{release} > \alpha_{attack} \quad (4c)$$

The smoothing coefficients $\alpha_{attack}$ and $\alpha_{release}$ are chosen to give the desired attack and release times. One way to specify this is the half-decay time of the smoothing filter, i.e., the time it takes the time smoothing filter's impulse response to decay to one half its original value. Although choosing $\alpha_{attack}$ corresponding to a half decay time of 1 second and $\alpha_{release}$ corresponding to a half decay time of 4 seconds works well for an AGC, the values are not critical. The value $L_{min}$ in Equation 4a represents a minimum level above which the instantaneous signal level L[t] must be in order for the smoothed level to be updated. This prevents the smoothed average level from falling too low, and the corresponding gain from rising too high, when the signal falls into relative silence. Assuming 0 dB represents the level of a full scale digital square wave, setting $L_{min} = -60$ dB is a reasonable choice, although the level is not critical.

From the smoothed average level $\bar{L}[t]$ and the AGC input/output function $F_{AGC}$, as shown in FIG. 4, the desired output level $\bar{L}_{out}[t]$ is computed:

$$\bar{L}_{out}[t] = F_{AGC}\{\bar{L}[t]\} \quad (5)$$

Finally, the gain G[t] is computed from the difference between the output level $\bar{L}_{out}[t]$ and the input level $\bar{L}[t]$:

$$G[t] = 10^{(\bar{L}_{out}[t] - \bar{L}[t])/20} \quad (6)$$

When $\bar{L}_{out}[t] > \bar{L}[t]$, the gain is greater than one, meaning the signal is boosted, and when $\bar{L}_{out}[t] < \bar{L}[t]$, the gain is less than one, meaning the signal is attenuated.

AGC with Reset

As mentioned above, the reset mechanism or function may cause one of two or both of two actions: (1) setting one or more time constants to a shorter value for a short period of time (thereby speeding up the adaptation rate of the audio processing), and (2) setting a smoothed measure of the audio signal level or one or more modification parameters to a stored value or to an average or default value, which may be expressed as $\bar{L}_{init}$ (see Eqn. 8a below and the descriptions before and after that equation). First, resetting of one or more time constants is described.

Because the modification parameter, gain G[t], is a function of the smoothed average level $\bar{L}[t]$, the rate at which the described AGC adapts to the audio is governed by the attack and release times used in computing $\bar{L}[t]$. As stated above, such smoothing time constants are chosen to be relatively large, on the order of several seconds, so that the AGC does not change the level of the audio too rapidly during the temporal evolution of normal audio content. However, if the audio content abruptly changes or has a discontinuity, the AGC may take too long to adapt, especially if the new content is at a significantly different level than the previous content. To speed up the adaptation, the reset signal described earlier may be used to trigger a modification of one or more of the time constants associated with the level smoothing. In this case, when a reset is triggered, the time constants quickly switch to significantly smaller values and then smoothly return to their original large values (or approximations thereof) over a specified period of time. Other methods for speeding up the adaptation rate after a reset is triggered are possible. For example, instead of smoothly returning to their original values or approximations thereof the time constants may be kept at their smaller values over a specified period of time and then returned directly to their original values or approximations thereof. Another possibility is to provide a step-wise return of the time constants over a specified period of time. The invention is not meant to be limited manner in which the time constants return to their original values or an approximation thereof.

To trigger a reset there may exist a binary reset signal R[t] such the R[t]=0 during normal operation and R[t]=1 when a reset is desired at time block t. The reset may be triggered by analyzing the audio signal or by an external source, as described earlier. Details of examples of triggering a reset through signal analysis are described below. In the case of an external trigger, there may exist a stored state with which the dynamics process may be reset, as shown in FIG. 3. For the described preferred embodiment, such a stored state may consist of the value of the smoothed average level $\bar{L}[t]$ at the last time block at which a particular audio source was processed. The initial state, retrieved from storage during an externally-triggered reset (or, alternatively, an initial state may be a default value whether or not an externally-triggered reset is employed), may be represented by the value $\bar{L}_{init}$.

From the binary reset signal R[t], a time constant control signal may be generated and subsequently used to shorten momentarily the time constants used in computing the smoothed average level $\bar{L}[t]$, thereby speeding up the processing adaptation rate. A time constant control signal c[t] may be computed so that it equals "1" at the moment a reset occurs (R[t]=1), and then decays exponentially to "0" at a rate controlled by a decay coefficient $\lambda<1$:

$$c[t] = 1 \text{ if } R[t] = 1 \quad (7a)$$
otherwise, $$c[t] = \begin{cases} \lambda c[t-1] & L[t] \geq L_{min} \\ c[t-1] & L[t] < L_{min} \end{cases} \quad (7b)$$

The decay coefficient $\lambda$ may be chosen to give a half decay time of one second, for example, which means that the smoothing time constants are shortened over a duration of approximately one second following a reset. Note also that the control signal may be updated only if the signal level $L[t] \geq L_{min}$ in order to prevent fast adaptation from occurring during relative silence.

Rather than using fixed attack and release coefficients to smooth the signal level, as shown in Equation 4b, the coefficients may now vary over time as a function of the time constant control signal c[t]. When c[t]=1, meaning that a reset has just occurred, the attack and release coefficients may be set equal to values significantly smaller than the values $\alpha_{attack}$ and $\alpha_{release}$ from Equation 4b (about ten percent of the original values or less, for example). As c[t] then decays to "0", the coefficients may be interpolated back to their nominal values of $\alpha_{attack}$ and $\alpha_{release}$. Optionally, in addition, the small coefficient values used immediately after a reset may also vary depending on whether an initial state value $\bar{L}_{init}$ exists. If no stored initial state exists, then very small coefficient values may be used, and if a stored initial state does exist, then slightly larger coefficient values may be used. In the latter case it is assumed that initializing $\bar{L}[t]$ with $\bar{L}_{init}$ starts $\bar{L}[t]$ at a value closer to the value to which it will eventually converge. Therefore, a slightly slower adaptation time, corresponding to larger coefficients, may be utilized in comparison to the case where no initial state is available. The adaptive smoothing process may be expressed as:

$$\bar{L}[t] = \bar{L}_{init} \text{ if } R[t] = 1 \text{ and } \bar{L}_{init} \text{ exists} \quad (8a)$$
otherwise, $$\bar{L}[t] = \begin{cases} \gamma[t] \cdot \bar{L}[t-1] + (1-\gamma[t])L[t] & L[t] \geq L_{min} \\ \bar{L}[t-1] & L[t] < L_{min} \end{cases} \quad (8b)$$

where $$\gamma[t] = \begin{cases} \gamma_{attack}[t] & L[t] \geq \bar{L}[t-1] \\ \gamma_{release}[t] & L[t] < \bar{L}[t-1], \end{cases} \quad (8c)$$

$$\gamma_{attack}[t] = c[t]\beta_{attack}[t] + (1-c[t])\alpha_{attack}, \quad (8d)$$

$$\gamma_{release}[t] = c[t]\beta_{release}[t] + (1-c[t])\alpha_{release}, \quad (8e)$$

$$\beta_{attack}[t] = \begin{cases} \beta_{afast} & R[t]=1 \text{ and } \bar{L}_{init} \text{ exists} \\ \beta_{aslow} & R[t]=1 \text{ and } \bar{L}_{init} \text{ does not exist} \\ \beta_{attack}[t-1] & \text{otherwise,} \end{cases} \quad (8f)$$

$$\beta_{release}[t] = \begin{cases} \beta_{rfast} & R[t]=1 \text{ and } \bar{L}_{init} \text{ exists} \\ \beta_{rslow} & R[t]=1 \text{ and } \bar{L}_{init} \text{ does not exist} \\ \beta_{release}[t-1] & \text{otherwise,} \end{cases} \quad (8g)$$

and $$\beta_{afast} < \beta_{aslow} << \alpha_{attack}, \quad (8h)$$

$$\beta_{rfast} < \beta_{rslow} << \alpha_{release} \quad (8i)$$

The values $\beta_{afast}$ and $\beta_{rfast}$ represent the initial attack and release smoothing coefficients immediately after a reset when no initial state, $\bar{L}_{init}$, is provided. Values corresponding to half decays times of 50 milliseconds and 200 milliseconds, respectively, have been found to be usable. The particular values are not critical. The values $\beta_{aslow}$ and $\beta_{rslow}$ represent the larger initial attack and release smoothing coefficients immediately after a reset when initial state, $\bar{L}_{init}$, is provided. In this case, values corresponding to half decays times equal to twice those of their faster counterparts; 100 milliseconds and 400 milliseconds, respectively, have been found to be usable. Also in this case, the particular values are not critical.

Reset Detection Through Signal Analysis

The most reliable method for triggering a reset in the disclosed invention is to receive a trigger externally from a mechanism or process that is known to be directly tied to the change of audio content. Several such mechanisms were discussed earlier; a channel change on a television set or an input selection change on an audio/visual receiver, for example. In many cases, however, no such external mechanisms may be available, and therefore the system must rely on analyzing the audio signal itself to determine if a reset should be triggered. Suppose, for example, that the disclosed invention resides in a television set to which a user has connected an external cable set-top box. The cable set-top box is responsible for tuning-in and changing channels, and the decoded audio is merely passed on to the television as a continuous audio stream. The television therefore receives no explicit information about when a new channel is selected. The only information available is that which may be inferred from the audio stream it receives.

A relatively simple but effective way to trigger a reset through signal analysis is to detect an occurrence in the temporal evolution of the audio signal in which the level of the audio signal remains below a threshold, $L_{silence}$, throughout a minimum time period (a time interval no shorter than a time threshold $t_{silence}$). In other words, to detect a period of relative silence having a duration at least as long as a specified threshold time interval. Such an occurrence is likely to indicate an abrupt change or discontinuity in the content of the audio. Many devices, cable set-top boxes in particular, mute the audio signal for a short period of time when the audio source changes. The act of muting reduces the audio signal to a level far lower than is generally encountered in normal audio content. In the case of digital audio, for example, it may reduce the samples of the signal to zero. Such conditions in the temporal evolution of the signal may be detected through analysis of the short-term level $L[t]$ discussed earlier. If $L[t]$ remains below than a threshold $L_{silence}$ throughout a time interval of at least $t_{silence}$, then a reset may be triggered. This approach may be expressed as:

$$R[t] = \begin{cases} 0 & s[t] < t_{silence} \\ 1 & s[t] \geq t_{silence} \end{cases} \quad (9a)$$

where a silence count signal $s[t]$ is updated according to:

$$s[t] = \begin{cases} 0 & L[t] > L_{silence} \\ s[t-1] + 1 & L[t] \leq L_{silence} \end{cases} \quad (9b)$$

Assuming that 0 dB corresponds to the level of a full scale digital square wave, then setting $L_{silence}$ equal to −90 dB, for example, works well in practice, although the level is not critical. Setting $t_{silence}$ to a time of 0.25 seconds, for example, is a reasonable choice for many applications, although the time period is not critical.

In some situations, a gap of relative silence may not be introduced when the audio content abruptly changes or has a discontinuity, and therefore the above technique may not be effective in triggering a reset. An alternative reset triggering occurrence to deal with additional cases is therefore desirable. In any situation in which the audio content abruptly changes or has a discontinuity, the level of the new audio will be either greater than, equal to, or less than the level of the previous audio content. Because most dynamics processors employ an attack that is significantly faster than its release, the case in which the level of the new audio content is greater than or equal to the old is less problematic than when the new audio content is significantly lower than the old. In the latter case, the slow release time may result in an objectionably long adaptation time. Therefore, triggering a reset when the new audio content is significantly lower than the old may be considered particularly desirable. To do so, one may exploit a feature common to most audio signals composed of natural sounds. Natural sounds may exhibit abrupt increases in level, but they generally exhibit a more gradual decay. Sounds that are cut off abruptly are not very common in most audio recordings. However, if audio content switches abruptly, through an input selection change for example, and the level of the new audio input is significantly lower than the old, then the resulting audio stream exhibits a drastic, unnatural, instantaneous drop in level. Such a drop in level may be detected from the short-term level $L[t]$ and used to trigger a reset.

Thus, another effective way to trigger a reset through signal analysis is to detect an occurrence in the temporal evolution of the audio signal in which the level of the audio signal decreases by an amount greater than a difference threshold $L_{drop}$ within a time interval no greater than a time threshold $t_{drop}$. More specifically, if the difference between $L[t]$ and $L[t-1]$ is more than a specified threshold $L_{drop}$ within a time interval $t_{drop}$, then a reset is triggered:

$$R[t] = \begin{cases} 1 & L[t] - L[t-1] < L_{drop} \\ 0 & \text{otherwise} \end{cases} \quad (10)$$

A suitable time difference $t_{drop}$ is the time of one digital processing block. For example, with a block overlap of one half, one block time corresponds to N/2 samples. If N=512 and the sampling rate is 48000 Hz, $t_{drop}$ is about 5 milliseconds. If N=1024, $t_{drop}$ is about 10 milliseconds. A level difference $L_{drop}$ of about −10 to −20 dB has been found suitable, although the level difference is not critical.

The above technique is effective in triggering a reset when the level of new audio content is significantly lower than the old, but it may sometimes be susceptible to falsely triggering a reset during normal audio content. The described technique looks for a drop in the total level of the signal, and sometimes a dominant portion of the audio signal, a kick drum for example, may exhibit such behavior, while the remaining portion of the signal does not. The dominant signal component, however, contributes most significantly to the overall level and therefore may cause a reset to be triggered. To deal with such unintended triggering, the detection scheme may be improved by detecting a reset when the level of the signal exhibits a significant level drop simultaneously across a plurality of frequency bands (for example, all frequency bands) within the threshold time period. This way, all such frequency bands contribute equally to the reset detection process, regardless of the absolute level in any given band. To implement such a technique, the instantaneous level within a plurality of frequency bands is first computed. This level is represented as $L[b,t]$, where b indicates the band index. It may be generated efficiently by computing the Discrete Fourier Transform (DFT) of each audio block $x[n,t]$ and multiplying the DFT with a bandpass frequency response $C_b[k]$ for each band b:

$$L[b, t] = 10\log_{10}\left(\sum_{k=0}^{N-1} C_b^2[k]|X[k, t]|^2\right) \quad (11a)$$

where X[k,t], the DFT of x[n,t], is computed as:

$$X[k, t] = \sum_{n=0}^{N-1} x[n, t] e^{-j\frac{2\pi kn}{N}} \quad (11b)$$

Figure 5:
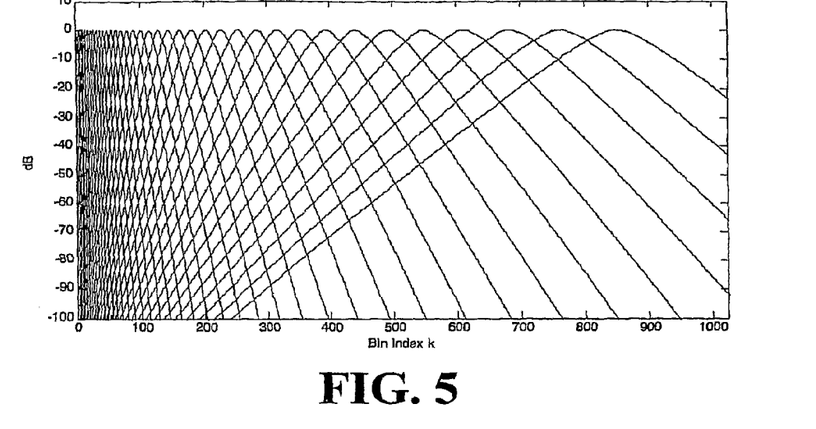
FIG. 5 shows a set of bandpass frequency responses chosen to mimic the critical band filtering observed along the basilar membrane in the human ear.

The set of bandpass frequency responses $C_b[k]$ may be advantageously chosen to mimic the critical band filtering observed along the basilar membrane in the human ear. As suggested by Moore and Glasberg ("A Model for the Prediction of Thresholds, Loudness, and Partial Loudness," Brian Moore, Brian Glasberg, and Thomas Baer, J. Audio Eng. Soc., Vol. 45, No. 4, 1997 April), such filters exhibit an approximately rounded exponential shape and are spaced uniformly on the Equivalent Rectangular Bandwidth (ERB) scale. FIG. 5 depicts a suitable set of filters with a spacing of 1 ERB, resulting in a total of 40 bands.

From the instantaneous level per band, L[b,t], the difference between successive time blocks, averaged across all bands may be computed:

$$D[t] = \frac{1}{B}\sum_{b=1}^{B} L[b, t] - L[b, t-1] \quad (12)$$

For real world audio signals, D[t] is extremely small only if the level of the signal drops significantly in the majority of bands b. If the difference is less than some threshold, $D_{drop}$, then a reset is detected:

$$R[t] = \begin{cases} 1 & D[t] < D_{drop} \\ 0 & \text{otherwise} \end{cases} \quad (13)$$

In practice, setting $D_{drop}$ between −10 and −20 dB works well, although the setting is not critical. The resulting multi-band technique is less susceptible to falsely triggering a reset than the simpler technique that looks only at the difference in total signal level.

Figure 6:
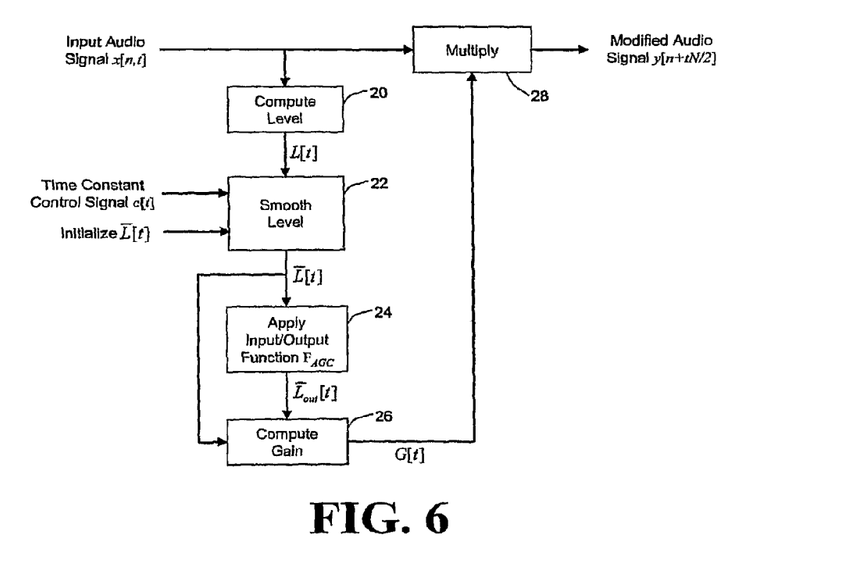
FIG. 6 is a schematic functional block diagram showing, in accordance with aspects of the present invention, an example of an AGC embodiment of the present invention.

FIG. 6 shows a block diagram of an AGC embodying aspects of the present invention. A digital audio input signal x[n,t] (see Eqn. 1) is applied to two paths of an AGC device or process. In the control path, a "Compute Level" device or process 20 computes a measure of the audio, which may be a time-varying instantaneous level of the signal L[t], computed as the mean square power of each block of the input signal x[n,t] (see Eqn. 3). Next, the instantaneous level L[t] is time smoothed in a "Smooth Level" device or process 22 to generate a smoothed average level of the audio signal E[t] (see Eqn. 4a). In the absence of a reset, the time smoothing may have a fast attack and a slow release characteristic. The Smooth Level 22 may be controlled by a "Time Constant Control Signal c[t]" input and/or an "Initialize L[t]" input. The Time Constant Control Signal c[t] input may cause one or more of the time constants employed in the Smooth Level 22 to be altered upon the occurrence of a reset, as described above. The Initialize $\bar{L}$[t] input may cause the output of the Smooth Level 22 to assume a stored or default value $\bar{L}_{init}$ upon occurrence of a reset, as described above. The Smooth Level 22 output $\bar{L}$[t] is applied to an "Apply Input/Output Function $F_{AGC}$" device or function 24 and to a "Compute Gain" device or function 26. Device or function 24 applies the function described in connection with FIG. 4 to provide a desired output level $\bar{L}_{out}$[t] (see Eqn. 5). The Compute Gain 26 computes the gain G[t] from the difference between the output level $\bar{L}_{out}$[t] and the input level $\bar{L}$[t] (see Eqn. 6). When $\bar{L}_{out}$[t]>$\bar{L}$[t], the gain is greater than one, meaning the signal is boosted, and when $\bar{L}_{out}$[t]<$\bar{L}$[t], the gain is less than one, meaning the signal is attenuated. The time varying gain G[t], a modification parameter, is then applied to "Multiply" device or process 28 where it is then multiplied with each block of the signal x[n,t] to produce a modified audio signal y[n+tN/2] (see Eqn. 2). Although as described, the gain modification parameter G[t] is frequency independent, a frequency-dependent gain modification parameter G[b,t] may be computed in which b is a band index. In this case Compute Level 20 may compute a frequency-dependent instantaneous signal level L[b,t], Smooth Level 22 may provide a frequency-dependent output $\bar{L}$[b,t] (its control inputs Time Constant Control Signal c[t] and Initialize $\bar{L}$[t] may also be frequency dependent), Apply Function $F_{AGC}$ may apply a frequency-dependent function, and Compute Gain 26 provides a frequency-dependent time-varying gain G[b,t].

Implementation

The invention may be implemented in hardware or software, or a combination of both (e.g., programmable logic arrays). Unless otherwise specified, the algorithms included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

A number of embodiments of the invention have been described. Nevertheless, it will be understood that various modifications may be made without departing from the spirit and scope of the invention. For example, some of the steps described herein may be order independent, and thus can be performed in an order different from that described.

The invention claimed is:

1. A method for processing an audio signal, comprising
controlling the dynamics of the audio signal using a dynamics control process or controller, wherein said dynamics control process or controller smooths the signal level of the audio signal and/or a dynamics gain modification parameter with a smoothing filter employing an adaptive time constant $\beta$,
detecting a first type of occurrence in the temporal evolution of the audio signal in which the level of the audio signal decreases by an amount greater than a difference threshold, $L_{drop}$, within a time interval no greater than a second time threshold, $t_{drop}$, wherein said detecting detects the decrease in level of the audio signal in a plurality of frequency bands,
detecting a second type of occurrence in the temporal evolution of the audio signal in which the level of the audio signal remains below a threshold, $L_{silence}$, throughout a time interval no shorter than a first time threshold, $t_{silence}$, and
resetting, using an explicit reset mechanism or process, the controlling of the dynamics control process of the audio signal in response to detecting either said first type of occurrence or said second type of occurrence, wherein resetting the controlling of the dynamics control process includes setting the smoothing filter time constant to a predetermined value $\beta_{fast}$, interpolating the time constant $\beta$ back to a value $\beta_{slow}$ over a predetermined period of time following the reset, $\beta_{fast}$ being a faster time constant than $\beta_{slow}$.

2. A method according to claim 1 wherein resetting the dynamics control process speeds up the rate at which the dynamics processing adapts to changes in the input signal.

3. A method according to claim 1 wherein resetting the dynamics control process sets the value of one or more process-controlling parameters or a signal of which such one or more process-controlling parameters are a function to a stored or default value.

4. A method according to claim 1 wherein resetting the dynamics control process shortens the value of one or more time constants employed in determining one or more process-controlling parameters or a signal of which such one or more process-controlling parameters are a function.

5. A method according to claim 1, further comprising
receiving an externally-supplied reset trigger signal indicating a change in the audio signal, and
resetting the dynamics control process in response to the reset trigger signal.

6. A method according to claim 5 wherein the reset trigger signal indicates one or more of
the act of a user changing a channel,
the act of a user changing input sources,
the act of a user selecting a play, rewind or forward function,
the switching of one file to another,
a change in program,
the switching of one audio coding format to another, and
a change in coding parameters.

7. Apparatus for processing an audio signal, comprising
means for controlling the dynamics of the audio signal using a dynamics control process or controller, wherein said dynamics control process or controller smooths the signal level of the audio signal and/or a dynamics gain modification parameter with a smoothing filter employing an adaptive time constant $\beta$,
means for detecting a first type of occurrence in the temporal evolution of the audio signal in which the level of the audio signal decreases by an amount greater than a difference threshold, $L_{drop}$, within a time interval no greater than a second time threshold, $t_{drop}$, wherein said means for detecting detects the decrease in level of the audio signal in a plurality of frequency bands,
detecting a second type of occurrence in the temporal evolution of the audio signal in which the level of the audio signal remains below a threshold, $L_{silence}$, throughout a time interval no shorter than a first time threshold, $t_{silence}$, and
means for resetting, using an explicit reset mechanism or process, the controlling of the dynamics control process in response to detecting either said first type of occurrence or said second type of occurrence, wherein said means for resetting the controlling of the dynamics control process includes means for setting the smoothing filter time constant to a predetermined value $\beta_{fast}$, means for interpolating the time constant $\beta$ back to a value $\beta_{slow}$ over a predetermined period of time following the reset, $\beta_{fast}$ being a faster time constant than $\beta_{slow}$.

8. Apparatus according to claim 7 wherein said means for resetting the dynamics control process speeds up the rate at which the dynamics processing adapts to changes in the input signal.

9. Apparatus according to claim 7 wherein said means for resetting the dynamics control process sets the value of one or more process-controlling parameters or a signal of which such one or more process-controlling parameters are a function to a stored or default value.

10. Apparatus according to claim 7 wherein said means for resetting the dynamics control process shortens the value of one or more time constants employed in determining one or more process-controlling parameters or a signal of which such one or more process-controlling parameters are a function.

11. Apparatus according to claim 7, further comprising
means for receiving an externally-supplied reset trigger signal indicating a change in the audio signal, and
means for resetting the dynamics control process in response to the reset trigger signal.

12. Apparatus according to claim 11 wherein the reset trigger signal indicates one or more of
the act of a user changing a channel,
the act of a user changing input sources,
the act of a user selecting a play, rewind or forward function,
the switching of one file to another,
a change in program,
the switching of one audio coding format to another, and
a change in coding parameters.

* * * * *